United States Patent
Mikelson et al.

(10) Patent No.: US 6,855,638 B2
(45) Date of Patent: Feb. 15, 2005

(54) PROCESS TO PATTERN THICK TiW METAL LAYERS USING UNIFORM AND SELECTIVE ETCHING

(75) Inventors: Hans Peter Mikelson, Eau Claire, WI (US); Michael Paul Fleischer, Eau Claire, WI (US); Gloria Marie Lee, Cadott, WI (US); Jason Christopherson, Chippewa Falls, WI (US)

(73) Assignee: Union Semiconductor Technology Corporation, Plymouth, MN (US)

( * ) Notice: Subject to any disclaimer, the term of this patent is extended or adjusted under 35 U.S.C. 154(b) by 0 days.

(21) Appl. No.: 10/396,168

(22) Filed: Mar. 24, 2003

(65) Prior Publication Data

US 2004/0192062 A1 Sep. 30, 2004

(51) Int. Cl.$^7$ ................ H01L 21/302; H01L 21/461
(52) U.S. Cl. ........................ 438/738; 438/689
(58) Field of Search .................. 438/738, 8, 680, 438/681, 683, 685, 689, 728, 732

(56) References Cited

U.S. PATENT DOCUMENTS

| | | | |
|---|---|---|---|
| 5,407,861 A | * 4/1995 | Marangon et al. | 438/680 |
| 5,607,818 A | * 3/1997 | Akram et al. | 430/311 |
| 5,804,502 A | * 9/1998 | Gabriel et al. | 438/628 |
| 5,990,561 A | * 11/1999 | Gabriel et al. | 257/773 |

* cited by examiner

Primary Examiner—David Nhu
(74) Attorney, Agent, or Firm—Jones Day

(57) ABSTRACT

A method processes a thick TiW metal layer (12) on a dielectric layer (15), where the dielectric layer (15) has been deposited on a substrate (14), such as a silicon substrate. The method deposits the TiW metal layer (12) onto the dielectric layer (15), such as silicon dioxide or silicon nitride, and then deposits a photoresist (10) over the TiW metal layer (12). The method removes substantially all of the TiW metal layer (12) not in contact with the photoresist (10) with a uniform etch, such as not more than 80% to 90% of the deposited TiW metal layer. Then, the TiW metal layer (12) is selectively etched to the dielectric layer (15), to remove the TiW metal layer (12) faster than the dielectric layer (15), such as 2.7 times faster.

20 Claims, 2 Drawing Sheets

PROCESS TO PATTERN THICK TIW METAL LAYERS USING UNIFORM AND SELECTIVE ETCHING

FIELD OF THE PRESENT INVENTION

This invention relates to the field of semiconductor manufacture, and more particularly to uniform patterning of titanium tungsten (TiW) greater than two thousand angstroms in thickness with selectivity to the underlying dielectric material.

BACKGROUND OF THE PRESENT INVENTION

The manufacture of semiconductors involves the patterning of semiconductor, dielectric and metallic films. This is accomplished by transferring a patterned photoresist or other masking layer to the desired film layer. This pattern transfer is typically accomplished using a plasma etch process.

Others have patterned layers of TiW less than two thousand angstroms in thickness. Most semiconductor processing does not use TiW layers greater than two thousand angstroms. The operation of certain electronic devices requires high currents. One example of such an electronic device is an MRAM or magnetoresistive memory. Because the currents are high, a suitable metal must be used that is resistant to electromigration problems. One such material is TiW. The thickness of TiW required to resist electromigration for MRAM devices is greater than two thousand angstroms. Current TiW etch processes have not demonstrated any plasma etch process with uniformity and selectivity suitable for use in production of very large scale integrated circuits with 0.5 micron design rules and with bit densities as high as one megabit per chip.

Therefore, there is a need to have a novel way of creating TiW structures two thousand angstroms thick and greater.

There is also a need for a novel method that provides uniformity and selectivity suitable for use in production of very large-scale integrated circuits with 0.5 micron design rules and with bit densities as high as one megabit per chip.

SUMMARY

The present invention solves these needs and other problems in the field of TiW metal layer manufacturing methods by providing, in most preferred aspects, a method including: providing a substrate; depositing a dielectric layer on the substrate; depositing an at least 2000 angstrom thick TiW metal layer onto the dielectric layer; depositing a photoresist over the at least 2000 angstrom thick TiW metal layer; uniformly etching the at least 2000 angstrom thick TiW metal layer to form an etched TiW metal layer portion; and selectively etching the etched TiW metal layer portion faster than the dielectric layer creating a uniformly patterned TiW metal layer.

In other aspects of the present invention, the method provides the substrate in the form of a semiconductor substrate.

In other aspects of the present invention, the method uniformly etches the at least 2000 angstrom thick TiW metal layer to form an etched TiW metal layer portion that is at least 200 angstroms thick.

In other aspects of the present invention, the method uniformly etches no more than 80% to 90% of the at least 2000 angstrom thick TiW metal layer to form the etched TiW metal layer portion.

In other aspects of the present invention, the method etches the at least 2000 angstrom thick TiW metal layer by processing in a Lam 9606 reactor with the following process settings:

Top Power = 350 Watts
Bottom Power = 93 Watts
Pressure = 7 mT            (milli Torricelli)
Ar = 32 sccm               (standard cubic centimeters per minute)
BCl3 = 24 sccm             (standard cubic centimeters per minute)
SF6 = 24 sccm              (standard cubic centimeters per minute)
Total flow = 80 sccm       (standard cubic centimeters per minute)
Gap = 3 cm                 (centimeter)
Clamp pressure = 5 T       (Torricelli)
Electrode temperature = 60° C.

In other aspects of the present invention, the method selectively etches the etched TiW metal layer portion at least 2.7 times faster than the dielectric layer.

In other aspects of the present invention, the method selectively etches the etched TiW metal layer portion to remove the etched TiW metal layer portion.

In other aspects of the present invention, the method selectively etches the etched TiW metal layer portion by processing in a Lam 9606 reactor with the following process settings:

Top Power = 600 Watts
Bottom Power = 70 Watts
Pressure = 10 mT           (milli Torricelli)
Ar = 0 sccm                (standard cubic centimeters per minute)
BCl3 = 80 sccm             (standard cubic centimeters per minute)
SF6 = 10 sccm              (standard cubic centimeters per minute)
Total flow = 90 sccm       (standard cubic centimeters per minute)
Gap = 3 cm                 (centimeter)
Clamp pressure = 5 T       (Torricelli)
Electrode temperature = 60° C.

In other aspects of the present invention, the method deposits an at least 2000 angstrom thick TiW metal layer in the form of an at least 2000 angstrom thick TiW metal film onto the dielectric layer.

In other aspects of the present invention, the method deposits an at least 2000 angstrom thick TiW metal layer in the form of an at least 3000 angstrom thick TiW metal film onto the dielectric layer.

In other aspects of the present invention, the method deposits a dielectric layer of silicon nitride on the substrate.

In other aspects of the present invention, the method deposits a dielectric layer of silicon dioxide on the substrate.

It is an object of the present invention to provide a novel method of fabricating a TiW structure.

It is a further object of the present invention to provide such a novel method of fabricating a TiW structure having a uniform TiW layer at least 2000 angstroms thick.

These and further objects and advantages of the present invention will become clearer in light of the following detailed description of an illustrative embodiment of this invention described in connection with the drawings.

DESCRIPTION OF THE DRAWINGS

The illustrative embodiment may best be described by reference to the accompanying drawings where.

Figure 1:
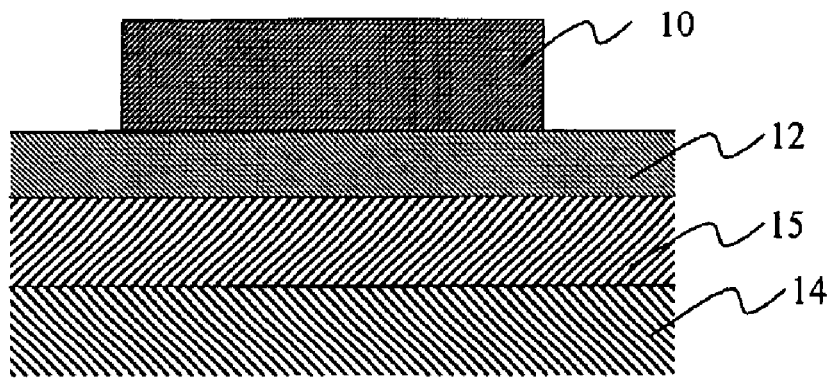
FIG. 1 shows a TiW layer deposited on a substrate and a photoresist layer deposited on the TiW layer according to the preferred teachings of the present invention.
Figure 2:
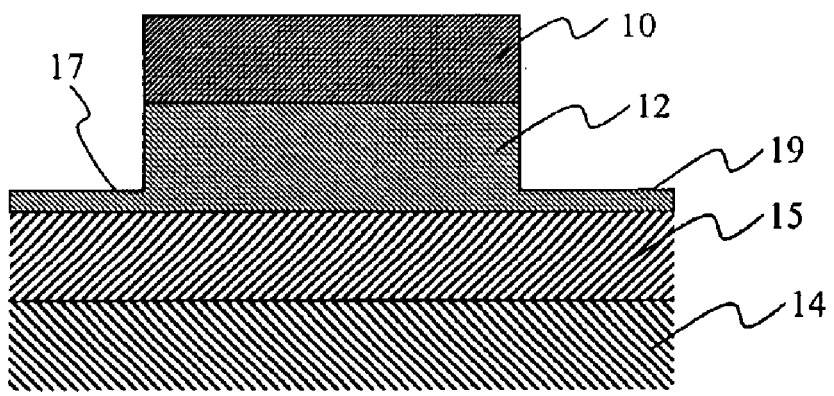
FIG. 2 shows a partially formed structure in a TiW layer on a substrate according to the preferred teachings of the present invention.
Figure 3:
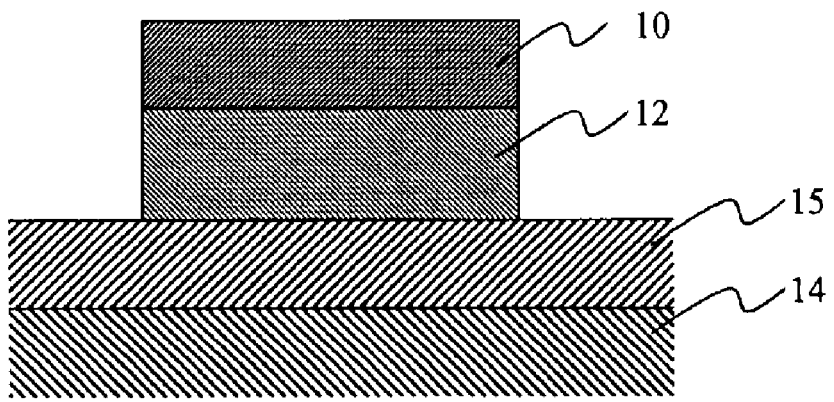
FIG. 3 shows a fully formed structure on a TiW layer in a substrate according to the preferred teachings of the present invention.

All figures are drawn for ease of explanation of the basic teachings of the present invention only; the extensions of the figures with respect to number, position, relationship, and dimensions of the parts to form the preferred embodiment will be explained or will be within the skill of the art after the following description has been read and understood. Further, the exact dimensions and dimensional proportions to conform to specific force, weight, strength, capacitance and similar requirements will likewise be within the skill of the art after the following description has been read and understood.

Where used in the various figures of the drawings, the same numerals designate the same or similar parts. Furthermore, when the terms "side," "end," "bottom," "first," "second," "laterally," "longitudinally," "row," "column," and similar terms are used herein, it should be understood that these terms have reference only to the structure shown in the drawings as it would appear to a person viewing the drawings and are utilized only to facilitate describing the illustrative embodiment.

DESCRIPTION OF THE PREFERRED EMBODIMENTS

Figure 4:
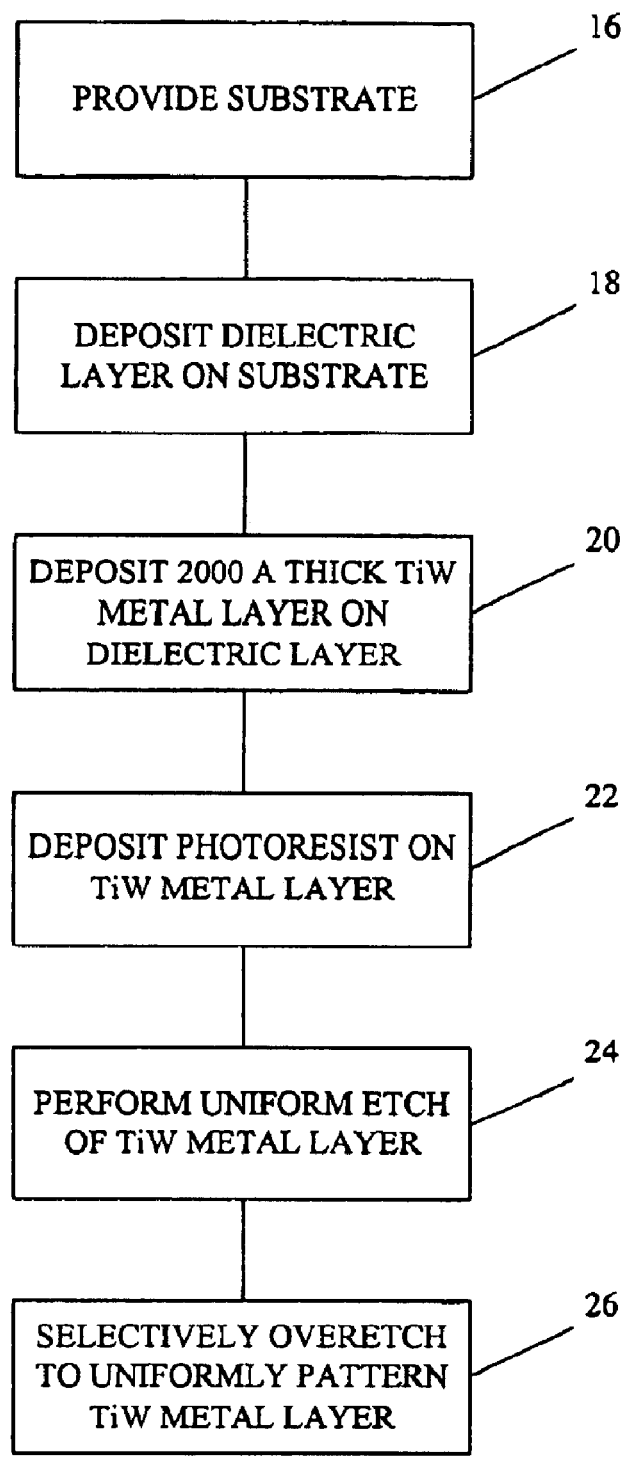
FIG. 4 shows a method, according to the preferred teachings of the present invention, of creating a fully formed structure in a TiW layer on a substrate.

A thick TiW metal layer constructed according to the preferred teachings of the present invention is shown in the drawings and generally designated 12. FIG. 4 diagrammatically shows a process for patterning TiW metal layer 12 uniformly with a thickness greater than two thousand angstroms and with selectivity to a dielectric layer 15. According to the preferred teachings of the present invention, the dielectric layer 15 can be an underlying semiconductor substrate with a dielectric layer. According to the preferred teachings of the present invention, the methods of the present invention are useful for creating microelectronic devices in the semiconductor. A substrate 14 is provided as diagrammatically indicated by box 16. According to the preferred teachings of the present invention, the substrate 14 is a semiconductor substrate made from a semiconductor such as silicon. The processes according to the preferred teachings of the present invention are useful in the formation of electromigration resistant electronic circuits. In general, underlying circuitry is fabricated using conventional methods and processes, employing one or more layers of conventional interconnects to produce a partially connected and partially functional front-end. The upper layer of the front-end is a material of a thickness sufficient for the designed purpose of the circuit. In an alternate embodiment according to preferred teachings of the present invention, the front-end is then used as the substrate 14, also having a dielectric layer, on which the specialized circuitry is fabricated.

The dielectric layer 15 is deposited on the substrate 14 as diagrammatically indicated by box 18. According to the preferred teachings of the present invention, the dielectric layer 15 may be a silicon nitride layer. Those skilled in the art will recognize that other dielectric materials compatible with the methods of the present invention, such as silicon dioxide may be used without deviating from the spirit and scope of the present invention.

The TiW metal layer 12, which according to the preferred teachings of the present invention is 2000 angstroms or greater, 3000 angstroms typical, is deposited on the dielectric layer 15 in a well known manner as is diagrammatically illustrated by box 20.

A photoresist 10 is then deposited on the TiW metal layer 12 in a well-known manner as is diagrammatically illustrated by box 22. According to the preferred teachings of the present invention, the photoresist 10 is a standard photoresist, such as a low contrast or high contrast photoresist such as AZ3312 and AZ7908 available from AZ Electronic Materials of Sommerville, N.J. These example photoresists are given by way of example, and not limitation, and those skilled in the art will recognize that other suitable photoresists may be used without deviating from the spirit and scope of the present invention. Photoresist 10 is deposited over the TiW metal layer 12 and patterned using conventional photolithographic techniques. According to the preferred teachings of the present invention, the TiW metal layer 12 is a TiW metal film.

A uniform etch of the TiW metal layer 12 is then performed as is diagrammatically illustrated by box 24. The TiW metal layer 12 is etched using a uniform process until most of the TiW metal layer 12 has been removed but the underlying dielectric layer 15 is not yet exposed to the plasma etch. The uniform etch forms a TiW metal layer portion 17 and TiW metal layer portion 19. According to the preferred teachings of the present invention, the uniform etch of the TiW metal layer 12 is a uniform plasma etch. According to the preferred teachings of the present invention, no more than 80% to 90% of the TiW metal layer 12 is etched by the uniform etching to form the TiW metal layer portion 17 and TiW metal layer portion 19. For example, a 2000 angstrom thick TiW metal layer 12 etches down to form 400 to 200 angstrom thick TiW metal layer portions 17 and 19.

According to the preferred teachings of the present invention, the main etch process was performed in a Lam 9606 reactor, available from LAM Research, Inc, with the following process settings:

Top Power = 350 Watts
Bottom Power = 93 Watts
Pressure = 7 mT (milli Torricelli)
Ar = 32 sccm (standard cubic centimeters/per minute)
BCl3 = 24 sccm (standard cubic centimeters/per minute)
SF6 = 24 sccm (standard cubic centimeters/per minute)
Total flow = 80 sccm (standard cubic centimeters/per minute)
Gap = 3 cm (centimeter)
Clamp pressure = 5 T (Torricelli)
Electrode temperature = 60° C.

The remaining TiW metal layer 12 is etched with a highly selective overetch to uniformly pattern the TiW metal layer 12 as is diagrammatically illustrated by box 26. According to the preferred teachings of the present invention, the selective etch is performed in the Lam 9606 reactor with a process that etches the TiW metal layer 12 selectively to the dielectric layer 15 to remove the remaining TiW metal layer 12 not covered by the photoresist 10. According to the preferred teachings of the present invention, the selective etch selectively etches the uniformly etched TiW metal layer 12 at least 2.7 times faster than the dielectric layer 15 creating the uniformly patterned TiW metal layer 12. According to the preferred teachings of the present invention, BCL3, boron trichloride, and SF6, sulfur hexafluoride, are used to etch the TiW metal layer 12 faster than the dielectric layer 15. The uniform etch etches the TiW metal layer 12 to a certain uniformity but does not break into the dielectric layer 15. The selective etch, because it etches the TiW metal layer 12 faster than the dielectric layer 15, allows the completion of the patterned TiW metal layer 12 by breaking through to the dielectric layer 15 while at the same time reducing the transfer of nonuniformity to the dielectric layer 15. The reduction in transfer of the nonuniformity is directly related to the selective etch rate. For example, with a 2.7 times ratio, nonuniformity in the TiW metal layer 12 will be reduced 2.7 times in the dielectric layer 15, thereby allowing for a uniformly patterned TiW metal layer 12. By not transferring nonuniformity to the dielectric layer 15 prevents shorting and exposure of underlying material to plasma that may be detrimental and creates devices that perform better with a process with higher yield.

In the most preferred form of the present invention, the selective etch process performs an overetch and is performed in the Lam 9606 reactor with the following process settings:

---

Top Power = 600 Watts
Bottom Power = 70 Watts
Pressure = 10 mT        (milliTorricelli)
Ar = 0 sccm             (standard cubic centimeters per minute)
BCl3 = 80 sccm          (standard cubic centimeters per minute)
SF6 = 10 sccm           (standard cubic centimeters per minute)
Total flow = 90 sccm    (standard cubic centimeters per minute)
Gap = 3 cm              (centimeter)
Clamp pressure = 5 T    (Torricelli)
Electrode temperature = 60° C.

---

Table A summaries the results of processing examples following the methods according to the preferred teachings of the present invention.

Thus since the present invention disclosed herein may be embodied in other specific forms without departing from the spirit or general characteristics thereof, some of which forms have been indicated, the embodiments described herein are to be considered in all respects illustrative and not restrictive. The scope of the present invention is to be indicated by the appended claims, rather than by the foregoing description, and all changes which come within the meaning and range of equivalency of the claims are intended to be embraced therein.

What is claimed is:

1. Method comprising:
   providing a substrate;
   depositing a dielectric layer on the substrate;
   depositing an at least 2000 angstrom thick TiW metal layer onto the dielectric layer;
   depositing a photoresist over the at least 2000 angstrom thick TiW metal layer;
   uniformly etching the at least 2000 angstrom thick TiW metal layer to form an etched TiW metal layer portion; and
   selectively etching the etched TiW metal layer portion faster than the dielectric layer creating a uniformly patterned TiW metal layer.

2. The method of claim 1 with providing the substrate comprising providing the substrate in the form of a semiconductor substrate.

3. The method of claim 1 with uniformly etching comprising uniformly etching the at least 2000 angstrom thick TiW metal layer to form the etched TiW metal layer portion that is at least 200 angstroms thick.

4. The method of claim 3 with selectively etching comprising selectively etching the etched TiW metal layer portion at least 2.7 times faster than the dielectric layer.

5. The method of claim 3 with selectively etching comprising selectively etching the etched TiW metal layer portion to remove the etched TiW metal layer portion.

TABLE A

| Exp. # | Run # | Power (T/B) | Pressure | TiW ER | TiW U(3sig.) | PR ER | PR U(3sig.) | SiN ER | SiN U(3sig.) | TiW:PR Sel. | TiW:SiN Sel. | |
|---|---|---|---|---|---|---|---|---|---|---|---|---|
| 1 | 4 | 520/80 | 10 | 2662 | 14.8 | 3311 | 17.7 | 2226 | 23.1 | 0.80 | 1.20 | |
| 2 | 2 | 520/80 | 7 | 2458 | 14.7 | 3089 | 16.4 | 2109 | 20.2 | 0.80 | 1.17 | |
| 3 | 5 | 350/93 | 10 | 2218 | 15.1 | 3691 | 17.1 | 2198 | 21.2 | 0.60 | 1.01 | |
| 4 | 3 | 350/93 | 7 | 2092 | 13.9 | 3448 | 13.4 | 2079 | 18.1 | 0.61 | 1.01 | Std Main Etch |
| 5 | 1 | 435/87 | 9 | 2328 | 16.5 | 3275 | 15.3 | 2082 | 20.5 | 0.71 | 1.12 | |

| Exp. # | Run # | Power (T/B) | BCL3 | SF6 | TiW ER | TiW U(3sig.) | PR ER | PR U(3sig.) | SiN ER | SiN U(3sig.) | TiW:PR Sel. | TiW:SiN Sel. | |
|---|---|---|---|---|---|---|---|---|---|---|---|---|---|
| 1 | 4 | 490/80 | 80 | 10 | 1174 | 32.7 | 1006 | 16.2 | 529 | 39.2 | 1.17 | 2.22 | |
| 2 | 2 | 600/70 | 80 | 10 | 1284 | 34.2 | 733 | 15.2 | 464 | 40.6 | 1.75 | 2.77 | Std OE |
| 3 | 5 | 490/80 | 90 | 0 | 106 | 25.2 | 373 | 43.7 | 7.5 | 4308 | 0.28 | 14.1 | |
| 4 | 3 | 600/70 | 90 | 0 | 1232 | 33.6 | 664 | 13.4 | 460 | 38.5 | 1.86 | 2.68 | |
| 5 | 1 | 545/75 | 85 | 10 | 1248 | 35.1 | 844 | 14.6 | 492 | 37.1 | 1.48 | 2.54 | |

Where:
Power (T/B) is the top and bottom electrode power.
Pressure is in Torricelli.
TiW ER is the TiW etch rate.
TiW U(3sig.) is the TiW non-uniformity.
PR ER is the photoresist etch rate.
PR U(3sig.) is the photoresist non-uniformity.
SiN ER is the SiN etch rate.
TiW:PR is the selectivity, as the ratio of TiW etch rate to the photoresist etch rate.
TiW:Si is the selectivity, as the ratio of the TiW etch rate to the SiN etch rate.
Ar is Argon
BCL3 is boron trichloride
SF6 is sulfur hexafluoride 6. The method of claim 3 with selectively etching comprising selectively overetching the etched TiW metal layer portion to remove the etched TiW metal layer portion.

7. The method of claim 1 with uniformly etching comprising uniformly etching no more than 80% to 90% of the at least 2000 angstrom thick TiW metal layer to form the etched TiW metal layer portion.

8. The method of claim 7 with selectively etching comprising selectively etching the etched TiW metal layer portion at least 2.7 times faster than the dielectric layer.

9. The method of claim 7 with selectively etching comprising selectively etching the etched TiW metal layer portion to remove the etched TiW metal layer portion.

10. The method of claim 7 with selectively etching comprising selectively overetching the etched TiW metal layer portion to remove the etched TiW metal layer portion.

11. The method of claim 1 with uniformly etching comprising uniformly etching the at least 2000 angstrom thick TiW metal layer by processing in a Lam 9606 reactor with the following process settings:

| | |
|---|---|
| Top Power = 350 Watts | |
| Bottom Power = 93 Watts | |
| Pressure = 7 mT | (milliTorricelli) |
| Ar = 32 sccm | (standard cubic centimeters/per minute) |
| BCl3 = 24 sccm | (standard cubic centimeters/per minute) |
| SF6 = 24 sccm | (standard cubic centimeters/per minute) |
| Total flow = 80 sccm | (standard cubic centimeters/per minute) |
| Gap = 3 | (centimeter) |
| Clamp pressure = 5 T | (Torricelli) |
| Electrode temperature = 60° C. | |

12. The method of claim 1 with selectively etching comprising selectively etching the etched TiW metal layer portion at least 2.7 times faster than the dielectric layer.

13. The method of claim 1 with selectively etching comprising selectively etching the etched TiW metal layer portion to remove the etched TiW metal layer portion.

14. The method of claim 1 with selectively etching comprising selectively overetching the etched TiW metal layer portion to remove the etched TiW metal layer portion.

15. The method of claim 1 with selectively etching comprising selectively etching the etched TiW metal layer portion by processing in a Lam 9606 reactor with the following process settings:

| | |
|---|---|
| Top Power = 600 Watts | |
| Bottom Power = 70 Watts | |
| Pressure = 10 mT | (milliTorricelli) |
| Ar = 0 sccm | (standard cubic centimeters per minute) |
| BCl3 = 80 sccm | (standard cubic centimeters per minute) |
| SF6 = 10 sccm | (standard cubic centimeters per minute) |
| Total flow = 90 sccm | (standard cubic centimeters per minute) |
| Gap = 3 cm | (centimeter) |
| Clamp pressure = 5 T | (Torricelli) |
| Electrode temperature = 60° C. | |

16. The method of claim 1 with depositing an at least 2000 angstrom thick TiW metal layer onto the dielectric layer comprising depositing an at least 2000 angstrom thick TiW metal film.

17. The method of claim 1 with depositing an at least 2000 angstrom thick TiW metal layer onto the dielectric layer comprising depositing an at least 3000 angstrom thick TiW metal film.

18. The method of claim 1 with depositing an at least 2000 angstrom thick TiW metal layer onto the dielectric layer comprising depositing an at least 3000 angstrom thick TiW metal film.

19. The method of claim 1 with depositing a dielectric layer comprising depositing a dielectric layer of silicon nitride on the substrate.

20. The method of claim 1 with depositing a dielectric layer comprising depositing a dielectric layer of silicon dioxide on the substrate.

* * * * *